United States Patent
Oh

[19]

[11] Patent Number: 6,026,055
[45] Date of Patent: *Feb. 15, 2000

[54] BURST PAGE ACCESS UNIT USABLE IN A SYNCHRONOUS DRAM AND OTHER SEMICONDUCTOR MEMORY DEVICES

[75] Inventor: Jong Hoon Oh, Ichon-shi, Rep. of Korea

[73] Assignee: Hyundai Electronics Industries Co., Ltd., Rep. of Korea

[*] Notice: This patent is subject to a terminal disclaimer.

[21] Appl. No.: 08/906,544

[22] Filed: Aug. 5, 1997

Related U.S. Application Data

[63] Continuation of application No. 08/649,764, May 15, 1996, Pat. No. 5,793,700.

[30] Foreign Application Priority Data

May 15, 1995 [KR] Rep. of Korea ................... 95-11882

[51] Int. Cl.[7] .................................................. G11C 8/00
[52] U.S. Cl. ................................ 365/238.5; 365/189.12; 365/233; 365/235
[58] Field of Search ............................. 365/238.5, 235, 365/233, 230.06, 230.08, 189.12

[56] References Cited

U.S. PATENT DOCUMENTS

| | | | |
|---|---|---|---|
| 5,487,049 | 1/1996 | Hang | 365/221 |
| 5,526,320 | 6/1996 | Zagar et al. | 365/233.5 |
| 5,530,955 | 6/1996 | Kaneko | 395/431 |

*Primary Examiner*—David C. Nelms
*Assistant Examiner*—Hien Nguyen
*Attorney, Agent, or Firm*—Townsend and Townsend and Crew LLP

[57] ABSTRACT

A burst page access unit for a semiconductor memory device which has a plurality of memory cell arrays for storing bit data therein. The burst page access unit comprises a row decoder for decoding a row address signal from an address input line in response to a row address strobe signal to select a desired one of the memory cell arrays, an internal address counter for incrementing a column address signal from the address input line by one in response to a column address strobe signal to generate an internal column address signal, and a column decoding circuit for decoding the internal column address signal from the internal address counter to select a desired one of memory cells in the memory cell array selected by the row decoder. According to the present invention, the burst page access unit can enhance the successive data access speed to increase the bandwidth of the semiconductor memory device.

15 Claims, 1 Drawing Sheet

BURST PAGE ACCESS UNIT USABLE IN A SYNCHRONOUS DRAM AND OTHER SEMICONDUCTOR MEMORY DEVICES

This is a continuation of application Ser. No. 08/649,764 filed May 15, 1996 the disclosure of which is incorporated by reference, now a U.S. Pat. No. 5,793,700.

BACKGROUND OF THE INVENTION

1. Field of the Invention

The present invention relates in general to a burst page access unit for successively accessing a series of data in a semiconductor memory device, and more particularly to a burst page access unit which is capable of rapidly accessing a series of data in a semiconductor memory device to increase the operation speed and bandwidth of the semiconductor memory device.

2. Description of the Prior Art

Generally, semiconductor memory devices such as a dynamic random access memory (referred to hereinafter as DRAM) and a static random access memory (referred to hereinafter as SRAM) comprise a burst page access unit to enhance data read and write speeds. The burst page access unit is adapted to designate a memory cell array in response to an external row address signal and then to sequentially designate memory cells in the designated memory cell array in response to external successive column address signals.

However, whenever the burst page access unit is applied with an external column address strobe signal CAS, it receives the column address signal to designate the corresponding memory cell. For this reason, the burst page access unit has a very long access time because of the column address signal input period and the latent period required in designating the corresponding memory cell in response to the inputted column address signal Recently, a synchronous DRAM has been developed to enhance the data access speed. The synchronous DRAM is adapted to write data in memory cells or to read data therefrom synchronously with an external clock signal. A conventional burst page access unit for the DRAM and SRAM may be used in the synchronous DRAM to access a series of data therein. However, the use of the conventional burst page access unit in the synchronous DRAM causes the data access time to become longer due to the synchronization with the clock signal.

SUMMARY OF THE INVENTION

Therefore, the present invention has been made in view of the above problems, and it is an object of the present invention to provide a burst page access unit which is capable of rapidly accessing a series of data in semiconductor memory devices such as a synchronous DRAM as well as a DRAM and an SRAM to increase the operation speed and bandwidth of the semiconductor memory devices.

In accordance with one aspect of the present invention, there is provided a burst page access unit for a semiconductor memory device, the semiconductor memory device having a plurality of memory cell arrays for storing bit data therein and a multiplexer for selecting the bit data stored in the memory cell arrays, comprising row decoding means for decoding a row address signal from an address input line in response to a row address strobe signal to select a desired one of the memory cell arrays; internal address generation means for incrementing a column address signal from the address input line by one in response to a column address strobe signal to generate an internal column address signal; column decoding means for decoding the internal column address signal from the internal address generation means to control the multiplexer to select a desired one of memory cells in the memory cell array selected by the row decoding means; and output means for outputting the bit data selected by the multiplexer externally.

In accordance with another aspect of the present invention, there is provided a burst page access unit for a semiconductor memory device, the semiconductor memory device having a plurality of memory cell arrays for storing bit data from the outside therein, comprising input means for inputting the bit data from the outside; a demultiplexer for distributing the bit data from the input means to the memory cell arrays; row decoding means for decoding a row address signal from an address input line in response to a row address strobe signal to select a desired one of the memory cell arrays, internal address generation means for incrementing a column address signal from the address input line by one in response to a column address strobe signal to generate an internal column address signal; and column decoding means for decoding the internal column address signal from the internal address generation means to control the demultiplexer to select a desired one of memory cells in the memory cell array selected by the row decoding means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
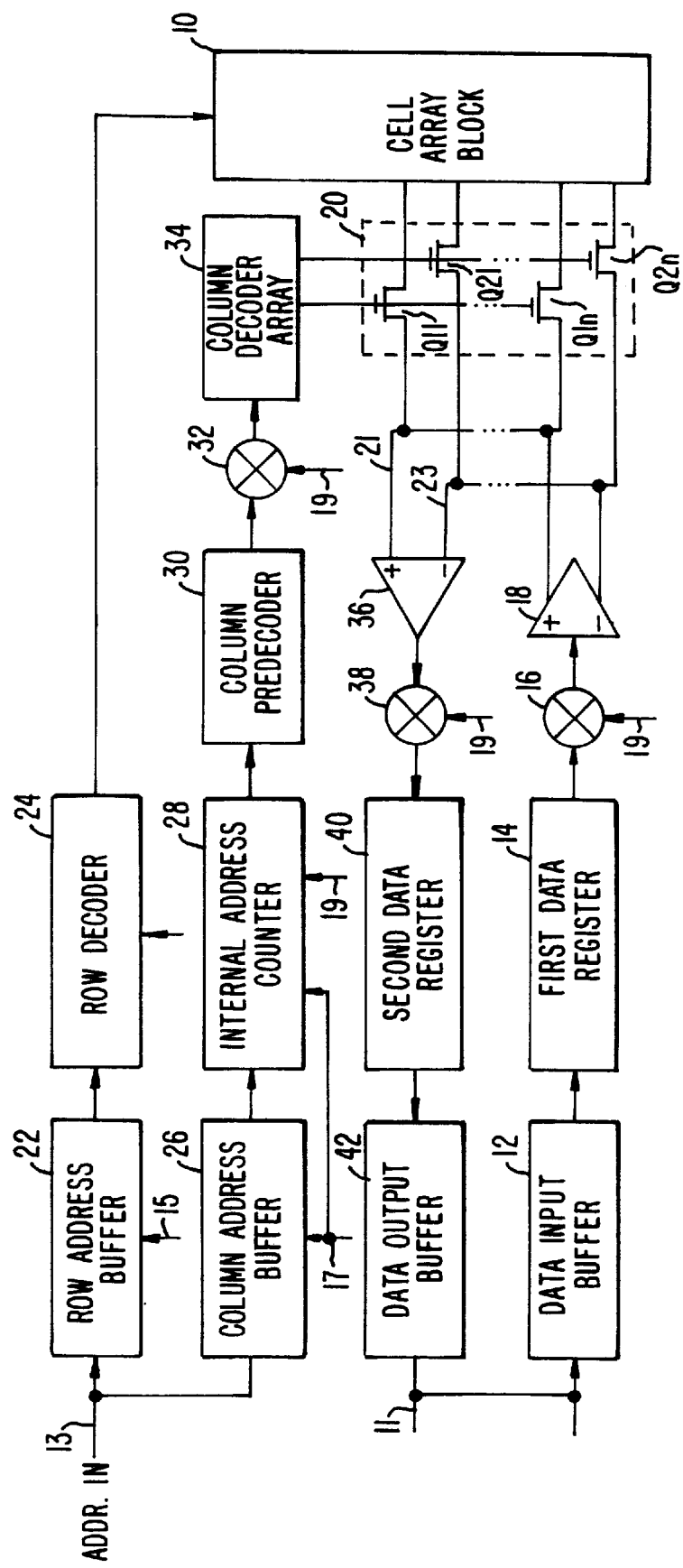
FIG. 1 is a circuit diagram of a burst page access unit for a semiconductor memory device in accordance with an embodiment of the present invention.

Referring to FIG. 1, there is shown a circuit diagram of a burst page access unit for a semiconductor memory device in accordance with an embodiment of the present invention. As shown in this drawing, a cell array block 10 is provided to store data therein and a data input buffer 12 is provided to buffer data transferred from a data input/output terminal 11. The cell array block 10 includes a plurality of memory cell arrays connected respectively to a plurality of row lines. Each of the memory cell arrays includes a plurality of memory cells connected respectively to a plurality of true and complementary column lines. In result, the cell array block 10 includes the plurality of memory cells connected to the plurality of column line pairs and the plurality of row lines in a matrix form.

The data input buffer 12 is adapted to supply the buffered data to a first data register 14. The first data register 14 temporarily stores the buffered data from the data input buffer 12 therein and supplies the stored data to a first synchronizing circuit 16. The first synchronizing circuit 16 synchronizes the output data from the first data register 14 with a clock signal from a clock line 19 and supplies the synchronized data to a first operational amplifier 18. The first operational amplifier 18 generates true and complementary data in response to the synchronized data from the first synchronizing circuit 16. Then, the first operational amplifier 16 supplies the generated true data to a true data bus 21 and the generated complementary data to a complementary data bus 23.

The burst page access unit comprises a data distribution circuit 20 connected between the true and complementary data buses 21 and 23 and the plurality of true and complementary column lines of the cell array block 10. The data distribution circuit 20 includes a plurality of NMOS transistors Q11–Q1n and a plurality of NMOS transistors Q21–Q2n. The NMOS transistors Q11–Q1n have their one terminals connected in common to the true data bus 21 and their other terminals connected respectively to the plurality of true column lines of the cell array block 10. The NMOS transistors Q21–Q2n have their one terminals connected in common to the complementary data bus 23 and their other terminals connected respectively to the plurality of complementary column lines of the cell array block 10. The NMOS transistor pairs connected to the true and complementary column lines of the cell array block 10 are selectively driven in response to respective control signals. The NMOS transistors of each pair are simultaneously driven in response to the same control signal.

The burst page access unit further comprises row and column address buffers 22 and 26 for commonly inputting an address signal from an address input line 13. The row address buffer 22 is driven when a row address strobe signal RAS from a first control line 15 is low in logic. As the row address buffer 22 is driven, it buffers the address signal from the address input line 13 and supplies the buffered address signal as a row address signal to a row decoder 24. The row decoder 24 enables one of the memory cell arrays in the cell array block 10 corresponding to a logic value of the buffered address signal from the row address buffer 22, On the other hand, the column address buffer 26 is driven when a column address strobe signal CAS from a second control line 17 is low in logic. As the column address buffer 26 is driven, it buffers the address signal From the address input line 13 and supplies the buffered address signal as a column address signal to an internal address counter 28.

The internal address counter 28 performs load and counting operations in response to the column address strobe signal CAS from the second control line 17. If the column address strobe signal CAS from the second control line 17 is low in logic, the internal address counter 28 receives the buffered address signal from the column address buffer 26. To the contrary, in the case where the column address strobe signal CAS from the second control line 17 is high in logic, the internal address counter 28 increments the received address signal by one whenever it is applied with the clock signal from the clock line 19. Then, the internal address counter 28 supplies the incremented address signal to a column predecoder 30.

The column predecoder 30 has the same number of output lines as there are the column line pairs in the cell array block 10. The column predecoder 30 decodes the column address signal from the internal address counter 28 to generate a column predecoded signal of high or low logic at its output line corresponding to a logic value of the column address signal.

The burst page access unit further comprises a second synchronizing circuit 32 for inputting the column predecoded signal from the column predecoder 30. The second synchronizing circuit 32 synchronizes the column predecoded signal from the column predecoder 30 with the clock signal from the clock line 19 and supplies the synchronized column predecoded signal to a column decoder array 34. The column decoder array 34 drives one of the plurality of NMOS transistor pairs Q11–Q1n and Q21–Q2n in the data distribution circuit 20 in response to the synchronized column predecoded signal from the second synchronizing circuit 32. The NMOS transistor pair in the data distribution circuit 20 selectively driven by the column decoder array 34 transfer the true and complementary data from the true and complementary data buses 21 and 23 to a corresponding one of the column line pairs in the cell array block 10, or the true and complementary data from the corresponding column line pair in the cell array block 10 to the true and complementary data buses 21 and 23.

The burst page access unit further comprises a second operational amplifier 36 for inputting the true and complementary data on the true and complementary data buses 21 and 23. The second operational amplifier 36 compares the true and complementary data on the true and complementary data buses 21 and 23 with each other and generates 1-bit data in accordance with the compared result. Then, the second operational amplifier 36 supplies the generated bit data to a third synchronizing circuit 38.

The third synchronizing circuit 38 synchronizes the bit data from the second operational amplifier 36 with the clock signal from the clock line 19 and supplies the synchronized bit data to a second data register 40. The second data register 40 temporarily stores the synchronized bit data from the third synchronizing circuit 38 therein and supplies the stored bit data to a data output buffer 42. The data output buffer 42 buffers the output data from the second data register 40 and transfers the buffered data to the peripheral circuits through the data input/output line 11.

As apparent from the above description, according to the present invention, the burst page access unit sequentially increments the input column address signal by one and then supplies the resultant column address signals. For this reason, the frequent column address input operation can be omitted in successively accessing a series of data. Therefore, the burst page access unit of the present invention can remove the column address signal input period and thus enhance the data access time as much as that.

Further, the burst page access unit of the present invention can remove the latent period from the column address signal input to the memory call designation. Therefore, the burst page access unit of the present invention can enhance the successive access speed still more.

Moreover, with the successive access speed enhanced, the burst page access unit of the present invention can significantly increase the bandwidth of semiconductor memory devices such as a DRAM, an SRAM and a synchronous DRAM.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A burst page access unit for a semiconductor memory device, said semiconductor memory device having a plurality of memory cell arrays for storing bit data therein and a select circuit for selecting the bit data stored in said memory cell arrays, comprising:

row decoder configured to decode a row address signal from an address input line in response to a first strobe signal to select a desired one of said memory cell arrays;

internal address generator configured to increment a column address signal from said address input line by one in response to a clock signal to generate an internal column address signal;

column decoder coupled to said internal address generator, and configured to decode the internal column address signal to control said select circuit to select a desired one of memory cells in the memory cell array selected by said row decoder; and output circuit coupled to said select circuit and configured to output the bit data selected by said select circuit externally.

2. A burst page access unit for a semiconductor memory device, as set forth in claim 1, wherein said column decoder comprises:

a column predecoder configured to predecode the internal column address signal from said internal address generator to select the desired one of the memory cells in the memory cell array selected by said row decoder;

a column decoder array coupled to and configured to drive said select circuit in response to an output signal from said column predecoder; and a synchronizing circuit coupled between said column predecoder and said column decoder array, and configured to synchronize the output signal from said column predecoder with a clock signal and further supply the synchronized signal to said column decoder array.

3. A burst page access unit for a semiconductor memory device, as set forth in claim 1, wherein said output circuit comprises:

a data output buffer coupled to said multiplexer and configured to output the selected bit data externally; and a synchronizing circuit coupled between said multiplexer and said data output buffer, and configured to synchronize the bit data selected by said multiplexer with a clock signal and further transfer the synchronized bit data to said data output buffer.

4. A burst page access unit for a semiconductor memory device, as set forth in claim 3, wherein said output circuit further comprises a data register coupled between said synchronizing circuit and said data output buffer, said data register configured to temporarily store the synchronized bit data from said synchronizing circuit and to supply the stored bit data to said data output buffer.

5. A burst page access unit for a semiconductor memory device, as set forth in claim 1, further comprising:

column address buffer coupled between said address input line and said internal address generator, said column address buffer configured to buffer the column address signal from said address input line in response to a second strobe signal and to supply the buffered column address signal to said internal address generator.

6. A burst page access unit for a semiconductor memory device, said semiconductor memory device having a plurality of memory cell arrays for storing bit data from the outside therein, comprising:

input circuit coupled to receive the bit data from the outside;

a select circuit coupled to distribute the bit data from said input circuit to said memory cell arrays;

row decoder configured to decode a row address signal from an address input line in response to a first strobe signal to select a desired one of said memory cell arrays;

internal address generator coupled to increment a column address signal from said address input line by one in response to a clock signal to generate an internal column address signal; and column decoder configured to decode the internal column address signal from said internal address generator to control said select circuit to select a desired one of memory cells in the memory cell array selected by said row decoder.

7. A burst page access unit for a semiconductor memory device, as set forth in claim 6, wherein said input circuit comprises:

a data input buffer coupled to receive the bit data from the outside and to transfer the buffered bit data to said select circuit; and a synchronizing circuit coupled between said data input buffer and said select circuit, said synchronizing circuit configured to synchronize the buffered bit data from said data input buffer with a clock signal and to supply the synchronized bit data to said select circuit.

8. A burst page access unit for a semiconductor memory device, as set forth in claim 7, wherein said input circuit further includes a data register coupled between said data input buffer and said synchronizing circuit, said data register coupled to temporarily store the buffered bit data from said data input buffer therein and to supply the stored bit data to said synchronizing circuit.

9. A semiconductor memory device comprising:

A row address buffer coupled to receive row address input in response to a row address strobe signal;

a row decoder coupled to said row address buffer and configured to decode said row address input;

a column address buffer coupled to receive column address input in response to a column address strobe signal;

an internal address counter coupled to said column address buffer, said internal address counter being configured to increment the column address input received from said column address buffer in response to a clock signal thereby generating internal column address signals;

a column decoder coupled to said internal address counter and configured to decode said internal column address signals; and a select circuit coupled to said column address decoder and configured to select a column of memory cells in response to the decoded internal column address signals.

10. The semiconductor memory device of claim 9 wherein said column decoder comprises:

a column predecoder coupled to said internal address counter;

a synchronizing circuit coupled to receive a clock signal and configured to synchronize an output of said column predecoder to said clock signal; and a column decoder array coupled to said synchronizing circuit.

11. The semiconductor memory device of claim 10 wherein said select circuit comprises a plurality of switch transistors configured to respectively couple columns of memory cells to a pair of true and complementary data buses.

12. The semiconductor memory device of claim 11 further comprising an input data path, said input data path comprising:

a data input buffer coupled to receive input data;

a data input synchronizing circuit coupled to said data input buffer and configured to synchronize said input data with a clock signal; and a data input amplifier coupled between said data input synchronizing circuit and said pair of true and complementary data buses.

13. The semiconductor memory device of claim 12 wherein said input data path further comprises a first data register coupled between said data input buffer and said data input synchronizing circuit.

14. The semiconductor memory device of claim 13 further comprising an output data path, said output data path comprising:
   a data output amplifier coupled to receive data output from said pair of true and complementary data buses;
   a data output synchronizing circuit coupled to receive an output of said data output amplifier; and
   a data output buffer coupled to said data output synchronizing circuit and configured to output said data output.

15. The semiconductor memory device of claim 14 wherein said data output path further comprises a second data register coupled between said data output synchronizing circuit and said data output buffer.

* * * * *

UNITED STATES PATENT AND TRADEMARK OFFICE
CERTIFICATE OF CORRECTION

PATENT NO.   : 6,026,055
DATED        : February 15, 2000
INVENTOR(S)  : Jong Hoon Oh Page 1 of 1

It is certified that error appears in the above-identified patent and that said Letters Patent is hereby corrected as shown below:

Claim 3, Column 5,
Lines 26, 29, 31, delete "multiplexer" and insert -- select circuit --;

Signed and Sealed this

Twenty-first Day of August, 2001

Attest:

*Nicholas P. Godici*

NICHOLAS P. GODICI
*Attesting Officer*      *Acting Director of the United States Patent and Trademark Office*